United States Patent
Hiatt et al.

(10) Patent No.: US 7,107,666 B2
(45) Date of Patent: Sep. 19, 2006

(54) METHOD OF MANUFACTURING AN ULTRA-MINIATURE MAGNETIC DEVICE

(75) Inventors: Fred C. Hiatt, Lakeville, MN (US); John E. DeCramer, Marshall, MN (US); Robert T. Fayfield, St. Louis Park, MN (US); Richard J. Rassel, Essex Junction, VT (US)

(73) Assignee: BH Electronics, Burnsville, MN (US)

( * ) Notice: Subject to any disclaimer, the term of this patent is extended or adjusted under 35 U.S.C. 154(b) by 608 days.

(21) Appl. No.: 10/077,180

(22) Filed: Feb. 15, 2002

(65) Prior Publication Data
US 2003/0005569 A1    Jan. 9, 2003

Related U.S. Application Data

(63) Continuation-in-part of application No. 09/530,371, filed as application No. PCT/US99/16446 on Jul. 23, 1999, now abandoned.

(60) Provisional application No. 60/093,824, filed on Jul. 23, 1998.

(51) Int. Cl.
H01F 7/06 (2006.01)
G11B 5/17 (2006.01)

(52) U.S. Cl. ............... 29/602.1; 29/603.24; 29/603.25; 29/606; 29/852; 438/671

(58) Field of Classification Search ............... 29/602.1, 29/603.23, 603.24, 603.25, 606, 846, 831, 29/852; 336/200, 205, 201; 438/669, 671, 438/761
See application file for complete search history.

(56) References Cited

U.S. PATENT DOCUMENTS 3,614,554 A    10/1971   Shield et al.

(Continued)

FOREIGN PATENT DOCUMENTS

DE    3346659 A1    12/1983

(Continued)

OTHER PUBLICATIONS

Littwin, B., "Buuble Circuit Fabrication by Electrodeposition", IEEE Transactions on Magnetics, vol. 1 Mag-11, No. 5, Sep. 1975, pp. 1139-1141.*

(Continued)

*Primary Examiner*—A. Dexter Tugbang
(74) *Attorney, Agent, or Firm*—Patterson, Thuente, Skaar & Christensen, P.A.

(57) ABSTRACT

An ultra-miniature magnetic device generally comprises a conductive winding and a magnetic core. The conductive winding includes an upper conductor and a lower conductor. The magnetic core is of an elongate rectangular or oval shape having two elongate sections and two short sections. The lower conductor is preferably positioned below the elongate sections of the magnetic core while the upper conductor is preferably positioned above the elongate sections of the magnetic core. The lower and upper conductors are electrically connected by conducting via structures that are formed in sequential steps using semiconductor processing technology. The result is a coil winding around the elongate sections, with the short sections being preferably free of windings. The process provides an advantage of avoiding shorting between the via structures and the magnetic core caused by overetching when etching the via holes.

25 Claims, 10 Drawing Sheets

U.S. PATENT DOCUMENTS

| | | | |
|---|---|---|---|
| 3,833,872 | A | 9/1974 | Marcus et al. |
| 3,874,075 | A | 4/1975 | Lohse |
| 4,649,639 | A | 3/1987 | Mas |
| 4,847,986 | A | 7/1989 | Meinel |
| 4,927,804 | A | 5/1990 | Zieren et al. |
| 5,070,317 | A | 12/1991 | Bhagat |
| 5,097,243 | A | 3/1992 | Zieren et al. |
| 5,398,400 | A | 3/1995 | Breen |
| 5,420,558 | A | 5/1995 | Ito et al. |
| 5,539,369 | A | 7/1996 | Selker et al. |
| 5,572,179 | A | 11/1996 | Ito et al. |
| 5,583,474 | A | 12/1996 | Mizoguchi et al. |
| 5,585,986 | A | 12/1996 | Parkin |
| 5,801,521 | A | 9/1998 | Mizoguchi et al. |
| 6,008,102 | A * | 12/1999 | Alford et al. .......... 29/602.1 X |
| 6,148,500 | A | 11/2000 | Krone et al. |
| 6,197,439 | B1 | 3/2001 | Parkin et al. |
| 6,240,622 | B1 | 6/2001 | Ahn et al. |

FOREIGN PATENT DOCUMENTS

| | | | |
|---|---|---|---|
| EP | 0006959 | 6/1979 | |
| EP | 0716434 | 6/1996 | |
| EP | 0762443 | 3/1997 | |
| EP | 0778593 | 6/1997 | |
| JP | 64-42110 | * 2/1980 | ............ 29/602.1 X |
| JP | 59-172710 | 9/1984 | |
| JP | 401053517 A | 3/1989 | |
| JP | 4-42905 | 2/1992 | |
| JP | 405144650 | 6/1993 | |
| JP | 406084646 A | 3/1994 | |
| JP | 63-9107 | 1/1998 | |

OTHER PUBLICATIONS

Park et al., "High Current Integrated Microinductors and Microtransformers using Low Temperature Fabrication Processes," *SPIE Proceedings* vol. 2920, 1996 International Symposium on Microelectronics, Minneapolis, Minnesota, USA, Oct. 1996.

Park et al., "A Comparison of Micromachined Inductors with Different Magnetic Core Materials," *IEEE 46th Electronic Components & Technology Conference*, Orlando, FL, pp. 375-381, 1996.

Ahn et al., "A Planar Micromachined Spiral Inductor for Integrated Magnetic Microactuator Applications," *J. Micromech. Microeng.*, vol. 3, pp. 37-44, 1993.

Ahn et al., "A Planar Variable Reluctance Magnetic Micromotor with Fully Integrated Stator and Coils," *Journal of Microelectromechanical Systems*, vol. 2, No. 4, pp. 165-173, Dec. 1993.

Ahn et al., "A New Toroidal-Meander Type Integrated Inductor with a Multilevel Meander Magnetic Core," *IEEE Transactions on Magnetics*, vol. 30, No. 1, pp. 73-79, Jan. 1994.

Ahn et al., "A Fully Integrated Planar Toroidal Inductor with a Micromachined Nickel—Iron Magnetic Bar," *IEEE Transactions on Components, Packaging, and Manufacturing Technology*, Part A., vol. 17, No. 3, pp. 463-469, Sep. 1994.

Ahn et al., "A Fully Integrated Surface Micromachined Magnetic Microactuator with a Multilevel Meander Magnetic Core," *Journal of Microelectromechanical Systems*, vol. 2, No. 1, pp. 15-22, Mar. 1993.

Mino et al., "Planar Microtransformer with Monolithically-Integrated Rectifier Diodes for Micro-Switching Converters," *IEEE Transactions on Magentics*, vol. 32, No. 2, pp. 291-296.

Hayano et al., "Development of Film Transformer," *IEEE Transactions on Magnetics*, vol. 30, No. 6, pp. 4758-4760, Nov. 1994.

Yamaguchi et al., "Characteristics of a Thin Film Microtransformer with Circular Spiral Coils," *IEEE Transactions on Magnetics*, vol. 29, No. 5, pp. 2232-2236, Sep.

Yamaguchi et al., "Characteristics of a DC-DC Converter Using a Thin Film Microtransformer and a Microinductor," *IEEE Translations Journal on Magnetics in Japan*, vol. 9, No. 6, pp. 84-89, Nov./Dec. 1994.

Yachi et al., "Thin Film Transformer Fabricated by a Dry Process," *NTT Review*, vol. 4, No. 3, pp. 46-50, May 1992.

Frazier et al., "Development of Micromachined Devices Using Polymide-Based Processes," *Sensors and Actuators A 45*, pp. 47-55, 1994.

* cited by examiner

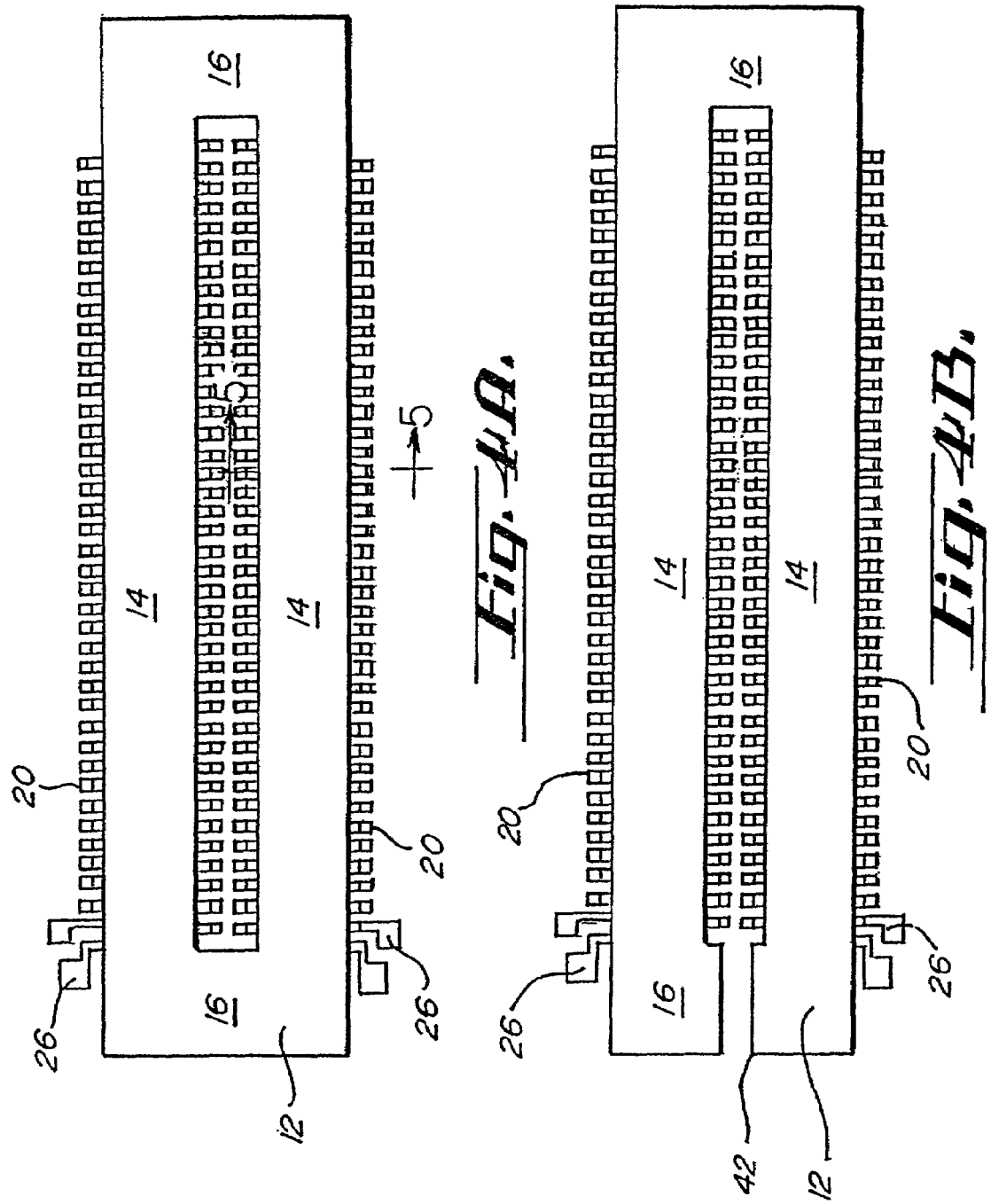

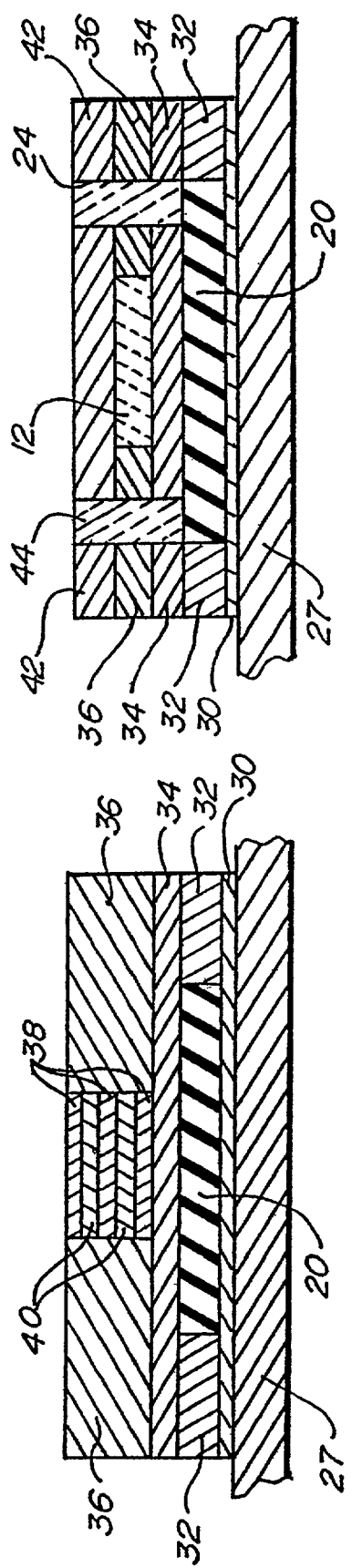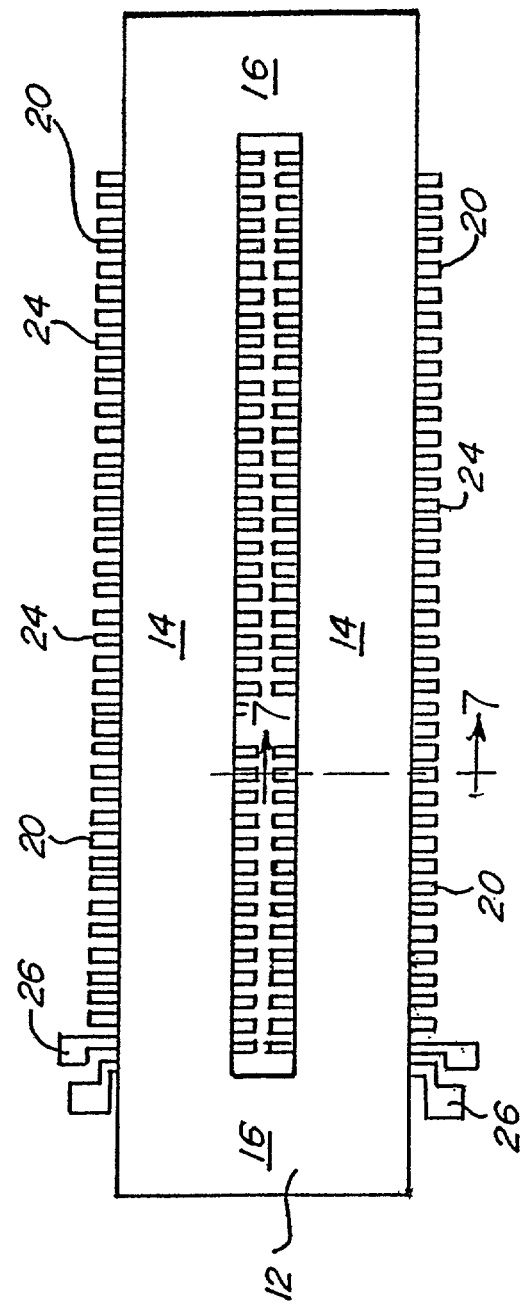

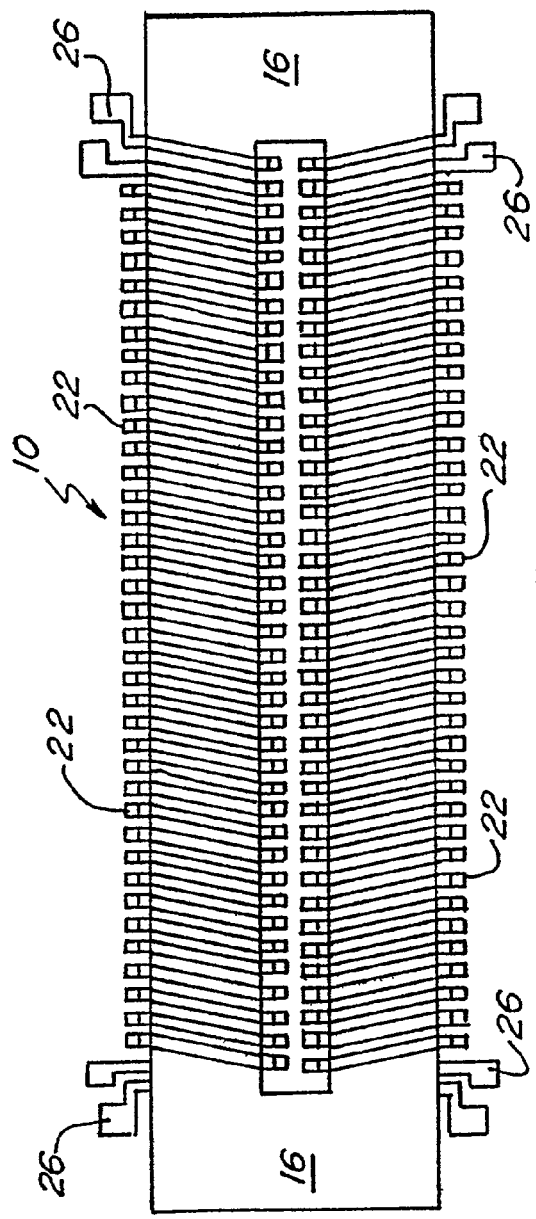
Fig. 8.
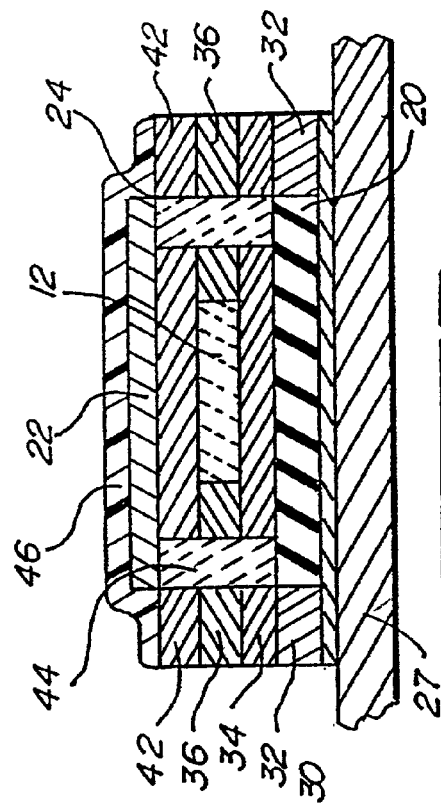
Fig. 9.
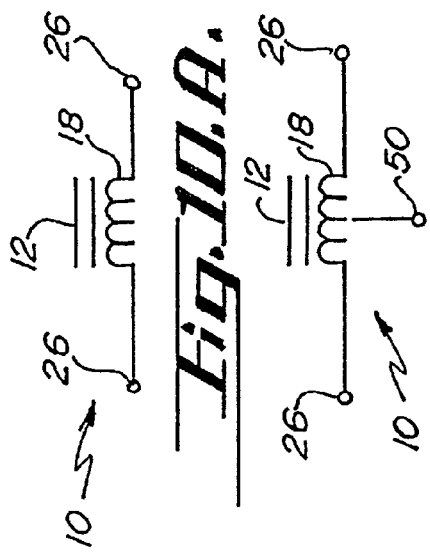
Fig. 10A.
Fig. 10B.

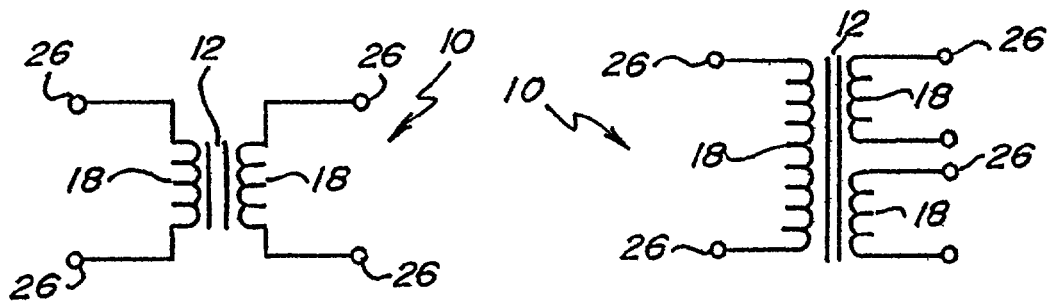
*Fig. 10C.*  *Fig. 10D.*
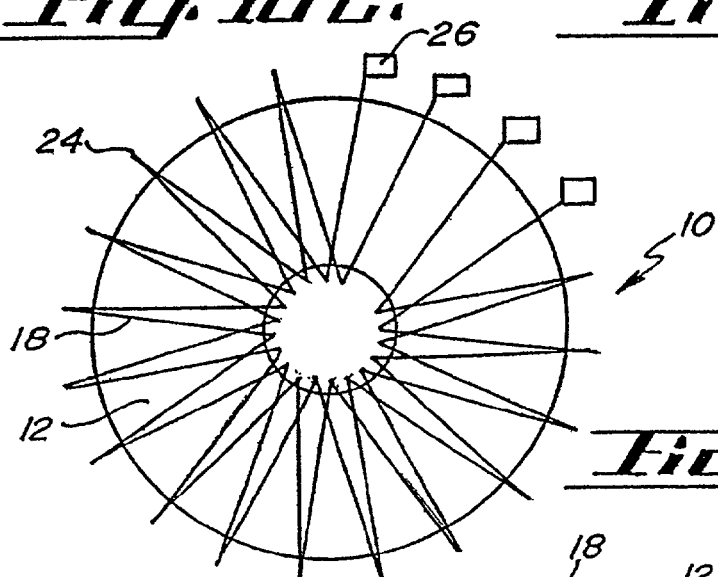
*Fig. 11.*
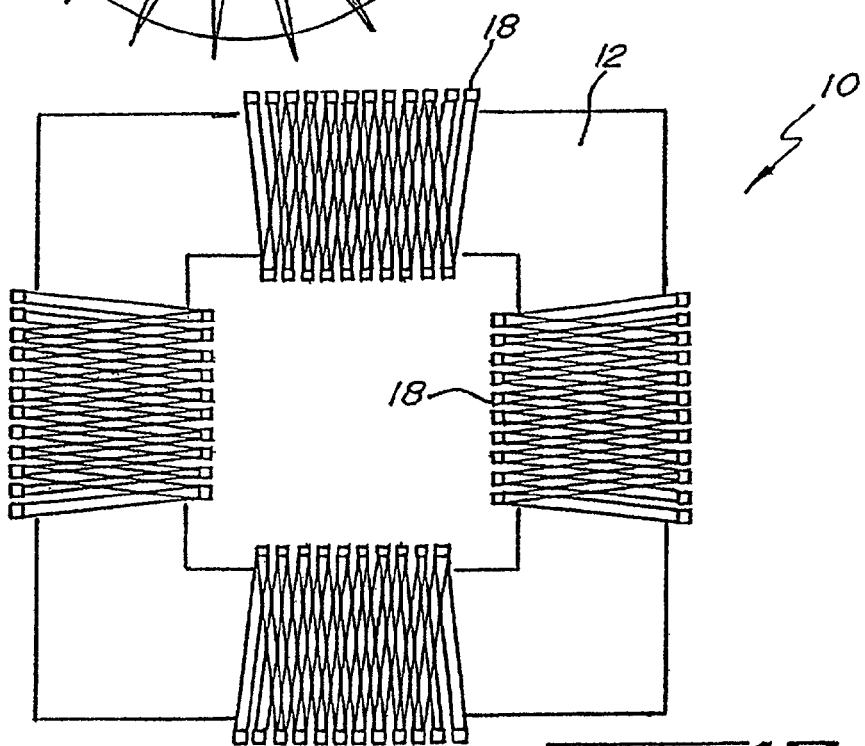
*Fig. 12.*

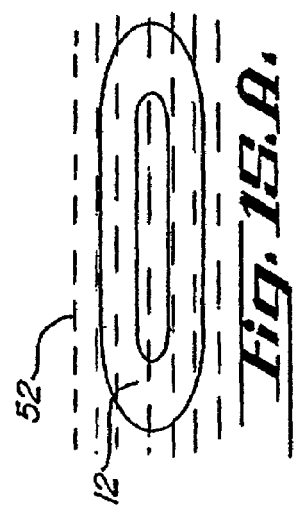
*Fig. 15.A.*
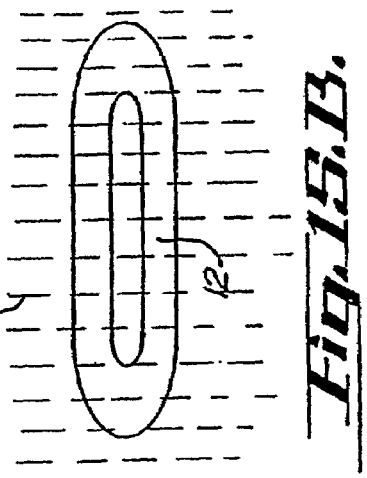
*Fig. 15.B.*
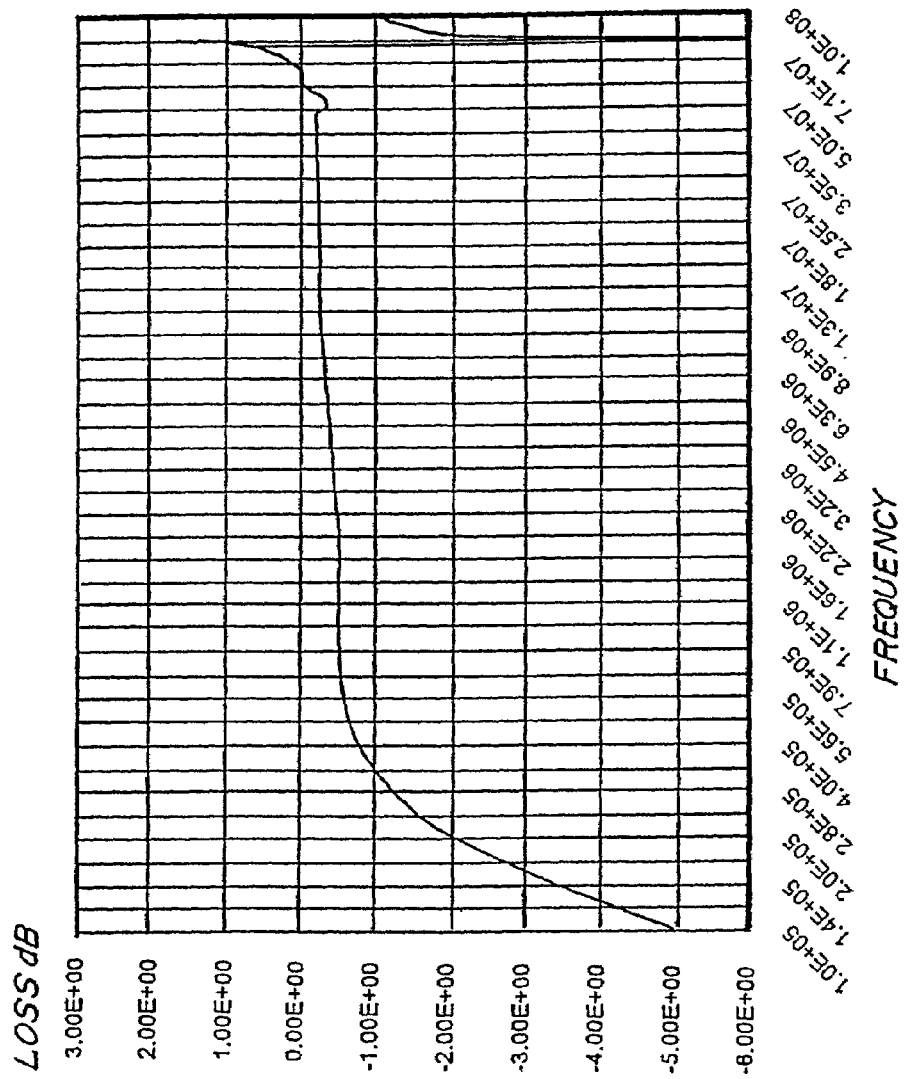
*Fig. 18.*

METHOD OF MANUFACTURING AN ULTRA-MINIATURE MAGNETIC DEVICE

RELATED APPLICATIONS

The present application is a continuation-in-part of application Ser. No. 09/530,371 filed on Apr. 27, 2000, now abandoned, which claims priority from the PCT Application filed on Jul. 23, 1999, having Ser. No. PCT/US99/16446 which claims priority from U.S. Provisional Application having Ser. No. 60/093,824, filed Jul. 23, 1998, which are hereby incorporated by reference in their entirety.

FIELD OF THE INVENTION

The present invention relates to transformers and inductors fabricated with high volume semiconductor technology production processes.

BACKGROUND OF THE INVENTION

High frequency magnetic components are used in many applications including computer data transmission, cable TV video, and interactive CATV, among others. These applications generally require transformers and inductors that operate efficiently in the frequency range from 5 MHz to 1 GHz and beyond. However, a problem with conventional magnetic components is that they are large and bulky in comparison to the circuits in which they operate.

Further, manufacturing techniques of magnetic components typically involve machine-winding techniques for large-cored magnetic components and hand winding for small-cored magnetic components. As operating frequencies increase, transformers and inductors typically decrease in size, having finer electrical wire and smaller magnetic cores; wire sizes of 42 gauge (0.075 mm in diameter) and core diameters of 2.5 mm are common. Machine assembly with these small cores is impractical. As such, hand winding of wire onto the magnetic core, hand assembly of the wound core on the mounting header, and hand soldering of the wire to header connectors is required. Because all of these operations require high levels of manual dexterity and are very time consuming, it is not uncommon for labor costs to represent 60–70% of the total product cost.

Some research has been performed in the area of microtransformers and micromachining using electroplating techniques to obtain very thick conductors and ferrite materials. However, since this research generally applies to sensors and higher power magnetic devices operating in lower frequency ranges, the research is generally not applicable or viable for high frequency applications.

In view of the above, there is a need for an innovative approach for manufacturing miniature high frequency inductors and transformers. The manufacturing approach preferably is automated so as to reduce manufacturing costs as well as reduce the size of high frequency magnetic components.

SUMMARY OF THE INVENTION

The needs described above are in large measure met by an ultra miniature magnetic device of the present invention. The ultra-miniature magnetic device generally comprises a conductive winding and a magnetic core. The conductive winding includes an upper conductor and a lower conductor. The magnetic core is of an elongate rectangular or oval shape having two elongate sections and two short sections. The lower conductor is preferably positioned below the elongate sections of the magnetic core while the upper conductor is preferably positioned above the elongate sections of the magnetic core. The lower and upper conductors are electrically connected by conducting vias resulting in a coil winding about the elongate sections. The short sections are preferably free of windings. The ultra-miniature magnetic device is preferably fabricated using high-volume, semi-conductor technology.

The coil windings may be a simple winding, a bifilar winding, or a multifilar winding. Further, the magnetic material may be subjected to an external magnetic field during fabrication to align the easy axis in a desired direction. The magnetic core may comprise a single layer of magnetic material or may comprise a number of layers of magnetic material, wherein each layer of magnetic material is separated by a dielectric material. The magnetic material may incorporate an air gap if suitable to the magnetic device application. Because of the generally rectangular or oval elongate shape of the magnetic core, it may be easily scaled in cross-sectional area to suit a specific magnetic device application. The magnetic device may be fabricated to operate at a range of frequencies from approximately 64 KHz to 2 GHz. The ultra miniature magnetic device may include center and offset taps.

A process of fabricating the ultra miniature magnetic device includes the steps of depositing the lower conductor atop a substrate, depositing the magnetic core atop the lower conductor, depositing the upper conductor atop the magnetic core, (with each layer separated by a dielectric layer) and electrically coupling the lower conductor to the upper conductor so as to configure the upper conductor and the lower conductor about at least one of the elongate sections of the magnetic core.

In an alternate method for fabricating a magnetic device using semiconductor technology, a first conductor is formed over a substrate and a first photoresist layer disposed over the first conductor is patterned to form via holes that expose a portion of the first conductor. A set of first partial via structures are formed within the via holes that are connected to the first conductor. The method also includes forming a second photoresist layer disposed over the first conductor and first partial via structures and using the second photoresist layer to form a magnetic core arrangement disposed over the first conductor. A third photoresist layer disposed over the magnetic core arrangement and the second photoresist layer is patterned to form via holes co-linear with the first partial via structures. A set of second partial via structures are formed within the co-linear via holes that are connected to the first partial via structures. The method further includes forming a second conductor over the magnetic core arrangement connected to the second partial via structures, thereby forming via structures adapted to electrically connect the first conductor to the second conductor. In this example embodiment, the first partial via structures are shorter than the second partial via structures that eventually form the via structures connecting the two conductors. In a related embodiment, the process of forming the via structures in the magnetic device are reversed such that the first partial via structures are longer than the second partial via structures.

In yet another method of fabricating a magnetic device using semiconductor technology, a first conductor is formed over a substrate and a first photoresist layer disposed over the first conductor is patterned to form via holes that expose a portion of the first conductor. The method includes forming a set of first partial via structures within the via holes that are connected to the first conductor and forming a magnetic core arrangement disposed over the first conductor using a portion of a second photoresist layer disposed over the first photoresist layer and the first partial via structures. The second photoresist layer is patterned to form via holes co-linear with the first partial via structures. A set of second partial via structures are formed within the co-linear via holes that are connected to the first partial via structures. The method further includes patterning a third photoresist layer that is disposed over the magnetic core arrangement and the second partial via structures to form via holes co-linear with the second partial via structures. A set of third partial via structures are formed within the co-linear holes that are connected to the second partial via structures. The method also includes forming a second conductor over the magnetic core arrangement that is connected to the third partial via structures, thereby forming via structures adapted to electrically connect the first conductor to the second conductor. In this example embodiment, the magnetic core arrangement is formed before second partial via structures are formed, while in a related embodiment the second partial via structures are formed before forming the magnetic core.

In a method for fabricating via structures adapted to connect a first and second conductor using semiconductor technology, the first conductor being formed over a substrate and the second conductor being formed over the first conductor, a composite metal layer is formed over the substrate. The method includes forming the first conductor using a photoresist mold formed on the composite metal layer, the photoresist mold exposing a portion of the composite metal layer, by removing a top layer of the composite metal layer and depositing a first conductor material within the photoresist mold and over the exposed portion of the composite metal layer. A photoresist layer disposed over the first conductor is patterned to form via holes that expose a portion of the first conductor. The method also includes forming via structures within the via holes that are connected to the first conductor and forming a second conductor seed layer over the photoresist layer and over the via structures. The second conductor is then formed over the second conductor seed layer and over the via structures.

The techniques used to deposit the conductors and magnetic core are preferably semi-conductor technology techniques including but not limited to: thin or thick film procedures, electroplating, vacuum deposition and etching processes—including PECVD, RF sputter deposition, reactive ion etching, ion milling, plasma etching, photo-lithographic processes and wet chemical etching.

DESCRIPTION OF THE DRAWINGS

FIG. 4A provides a top view of a magnetic core, the result of a second stage of fabrication of ultra-miniature magnetic device of the present invention.

FIG. 4B provides a top view of a magnetic core incorporating a gap, the result of a second stage of fabrication of ultra-miniature magnetic device of the present invention.

FIG. 5B is a cross-sectional view taken along line 5—5 of FIG. 4A wherein the magnetic core comprises a plurality of layers of magnetic core material.

FIG. 6 provides a top view of conducting vias, the result of a third stage of fabrication of ultra-miniature magnetic device of the present invention.

FIG. 7 is a cross-sectional view taken along line 7—7 of FIG. 6.

FIG. 8 provides a top view of an upper conductor, the result of a fourth stage of fabrication of ultra-miniature magnetic device of the present invention.

FIG. 9 is a cross-sectional view taken along line 9—9 of FIG. 8.

FIG. 10A depicts one use of ultra-miniature magnetic device of the present invention, specifically an inductor.

FIG. 10B depicts one use of ultra-miniature magnetic device of the present invention, specifically a center-tapped inductor.

FIG. 10C depicts one use of ultra-miniature magnetic device of the present invention, specifically a transformer.

FIG. 10D depicts one use of ultra-miniature magnetic device of the present invention, specifically a transformer with a single primary coil and two secondary coils.

FIG. 11 depicts a circular configuration of ultra-miniature magnetic device of the present invention.

FIG. 12 depicts a square configuration of ultra-miniature magnetic device of the present invention.

FIG. 15A depicts the magnetic core subject to a magnetic field to orient the easy magnetic axis in the direction of the core.

FIG. 15B depicts the magnetic core subject to a magnetic field to orient the easy magnetic axis at 90° to the direction of the core.

FIG. 18 is a plot of frequency vs. dB loss for an Ethernet transformer.

DETAILED DESCRIPTION OF THE PREFERRED EMBODIMENTS

Figure 1A:
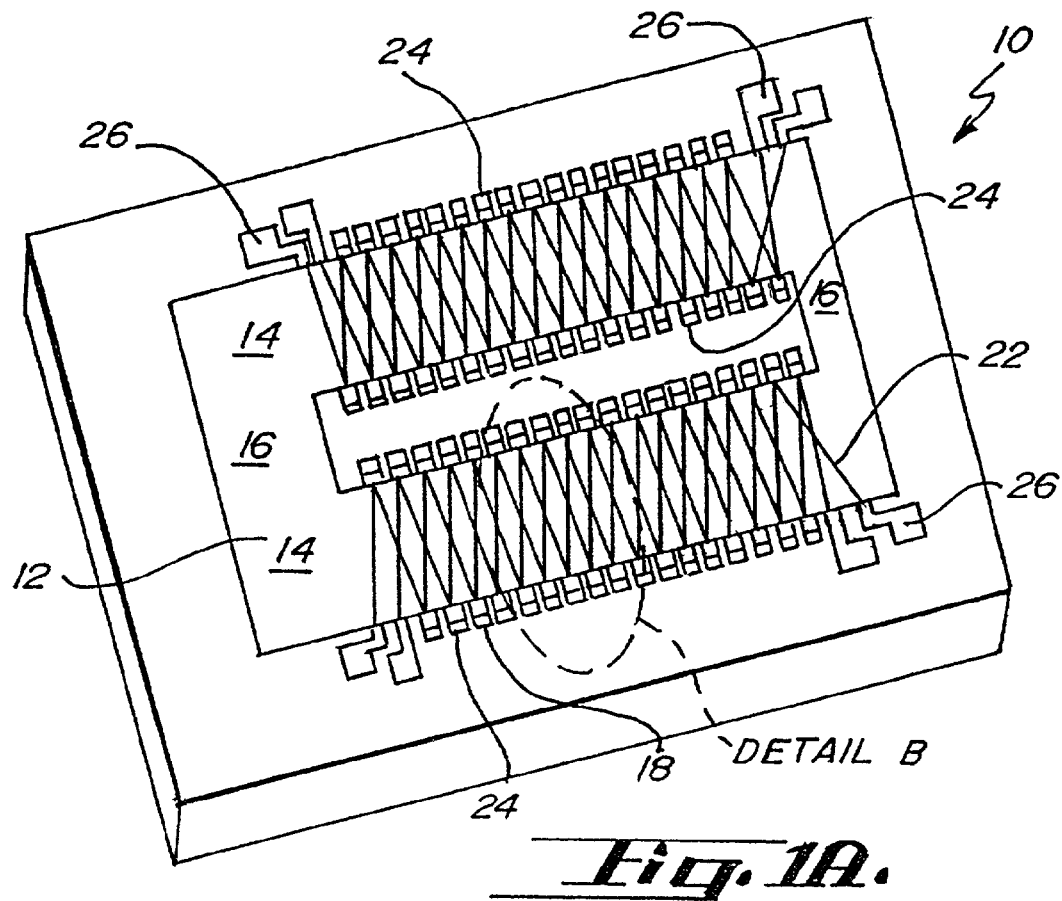
FIG. 1A is perspective view of an ultra-miniature magnetic device of the present invention.
Figure 1B:
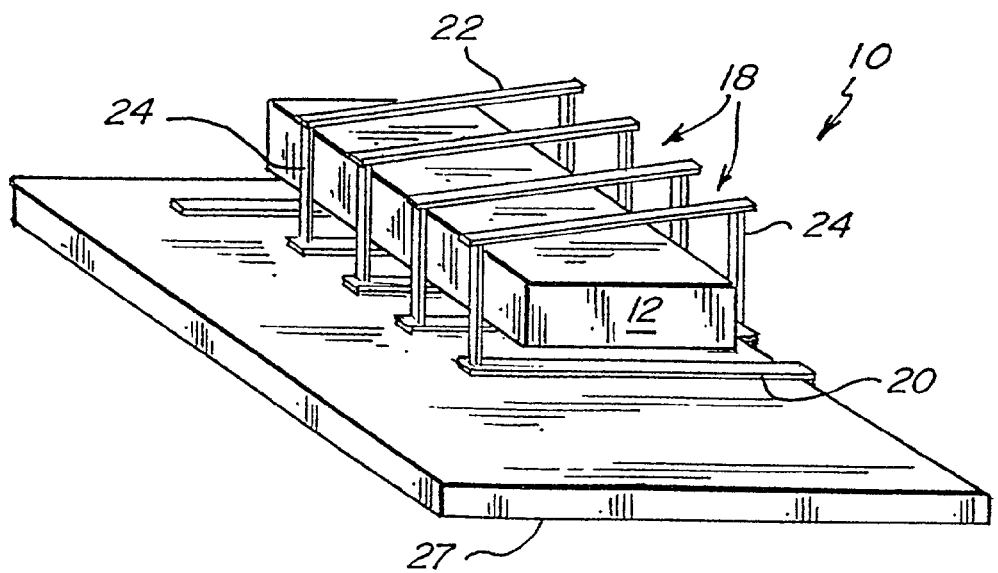
FIG. 1B is an exploded view of detail B of FIG. 1A.

An ultra-miniature magnetic device 10 of the present invention is depicted in FIGS. 1A–B. As shown, device 10 generally includes a magnetic core 12, which is preferably in the configuration of an elongated rectangle or oval having two elongate sides 14 and two short sides 16, and a coil winding 18, which is preferably comprised of a lower conductor 20 and an upper conductor 22 connected by conducting vias 24. Bonding pads 26 are provided on coil winding 18 for connection to external circuitry. Ultra-miniature magnetic device 10 is preferably fabricated atop a silicon substrate 27 although other possible substrates such as glass, fiberglass, polyimide, ceramics and other insulating materials can be used.

I. Fabrication of Ultra-Miniature Magnetic Device

Device 10 is preferably fabricated using automated, semiconductor fabrication processes. In general, four main stages define the fabrication process: (1) Creation of lower conductor 20; (2) Addition of magnetic core 12; (3) Establishment of vias 24 and filling vias with conducting material; and (4) Addition of upper conductor 22.

I.A. Stage 1: Creation of Lower Conductor

Figure 2:
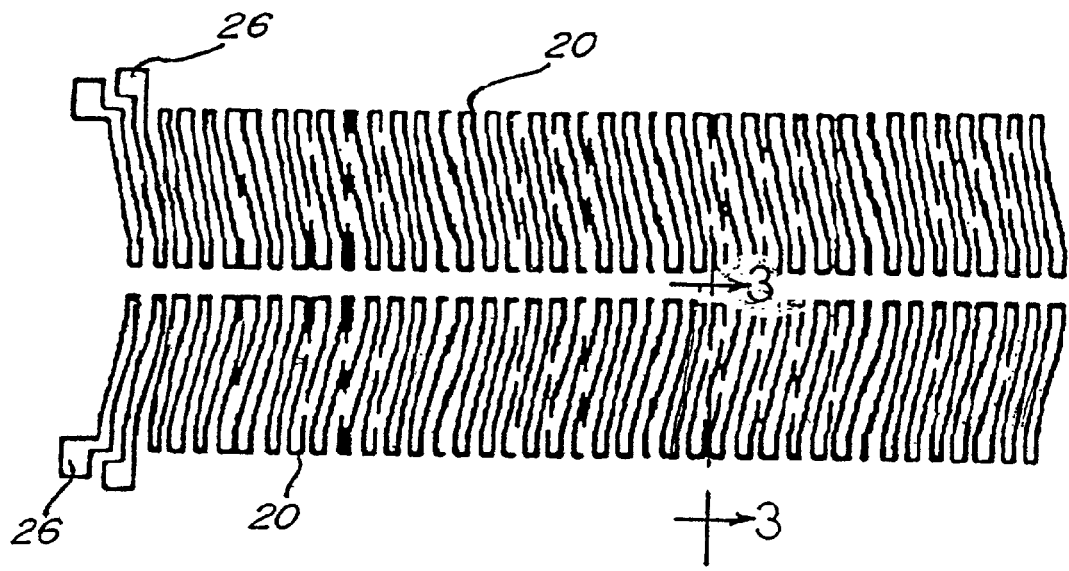
FIG. 2 provides a top view of a lower conductor, the result of a first stage of fabrication of ultra-miniature magnetic device of the present invention.
Figure 3:
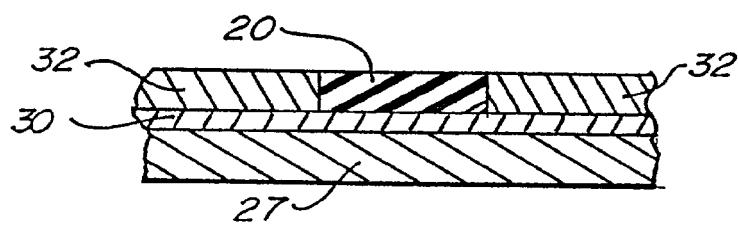
FIG. 3 is a cross-sectional view taken along line 3—3 of FIG. 2.

To create lower conductor 20, in reference to FIGS. 2 and 3, an insulating substrate, e.g., silicon wafer or other suitable material such as glass or ceramic, is preferably oxidized in a wet oxide ($O_2$) oxidation furnace to produce a layer of silicon dioxide ($SiO_2$) 30. Alternatively, an electroplating process may be used to create lower conductor 20. In the case of using electroplating process to form the conductors, a seed layer of titanium/copper/titanium or any suitable material is first deposited on the oxide surface to provide a conducting layer for the plating process. Next, an insulating layer 32 of polymer, or other suitable dielectric material, is deposited atop the silicon dioxide or seed layer. The thickness of insulating layer 32 is preferably equivalent to a predetermined thickness of lower conductor 20, with the predetermined thickness taking into account the resistance of the conducting material, as is described in further detail in Section II below.

With insulating layer 32 in place, a photoresist layer is deposited atop insulating layer 32 and defined with a lower conductor photomask. Insulating layer 32 is then defined by standard thin film techniques to create a trench for lower conductor 20. The conductor material is then preferably electroplated or sputter deposited. In the case of sputter deposition the photoresist layer is subsequently etched, or otherwise dissolved, to produce lower conductor 20 of coil winding 18. The conductor material is preferably copper, however, other suitable conductors, e.g., silver, aluminum, or gold may be used without departing from the spirit or scope of the invention.

FIG. 2 depicts a top view of partially completed device 10 after completion of stage 1. FIG. 3 depicts a cross-sectional view of partially completed device 10 after completion of stage 1; silicon dioxide layer 30, insulating layer 32, and lower conductor 20 are depicted.

I.B. Stage 2: Addition of Magnetic Core

To add magnetic core 12 to lower conductor 20, with reference to FIGS. 4A–4B and 5A–5B, a dielectric layer 34 is preferably first deposited over conductor 20 to provide isolation between lower conductor 20 and magnetic core 12. The dielectric layer 34 is preferably an insulating polymer or silicon dioxide; however, other dielectrics may be used without departing from the spirit or scope of the invention. If it is desired to use an electroplating process to form the magnetic core, a seed layer of titanium/copper/titanium or other suitable conducting material is preferably first deposited on the oxide surface to provide a conductive layer for the plating process. Next, an insulating layer 36 of polymer, or other suitable dielectric material, is deposited atop the dielectric and seed layer 34. The thickness of insulating layer 36 is preferably equivalent to a predetermined thickness of magnetic core 12, with the predetermined thickness of magnetic core 12 taking into account the permeability and the saturation level of the magnetic core material 38, as is described in further detail in Section II below.

With insulating layer 36 in place, a photoresist layer is deposited atop insulating layer 36 and defined using a magnetic core mask. Insulating layer 36 is then defined by standard thin film techniques to create a trench for formation of magnetic core 12. Magnetic core material 38 is then preferably electroplated or sputter deposited and, if desired, submitted to an external magnetic field to orient the grain structure, i.e., easy axis, of magnetic material in a desired direction. Magnetic core material 38 is preferably a iron/nickel/cobalt composition (15/65/20%), however, other magnetic core materials, e.g., nickel/iron (80/20%), may be used without departing from the spirit or scope of the invention. In the case of sputter deposition, the photoresist layer is etched, or otherwise dissolved, whereby unwanted magnetic core material 38 is removed.

While magnetic core 12 may comprise a single layer of magnetic core material 38, it may be desirable that magnetic core 12 comprise a plurality of very thin magnetic core material 38 layers, wherein each magnetic core material 38 layer is separated from the next by a dielectric layer 40. Using the plurality of magnetic core material 38 layers to form magnetic core 12 significantly lowers eddy current losses in magnetic core 12. In addition, each layer of the multilayer magnetic structure can have its easy axis oriented independently of the other layers.

Further, depending on desired design parameters, magnetic core 12 may be of a closed nature or, alternatively, a small gap 42 may be provided in magnetic core 12 by changing a mask layer. The gap enables higher levels of energy to be stored in magnetic core 12 thereby expanding the number of applications for the magnetic device.

Figure 5A:
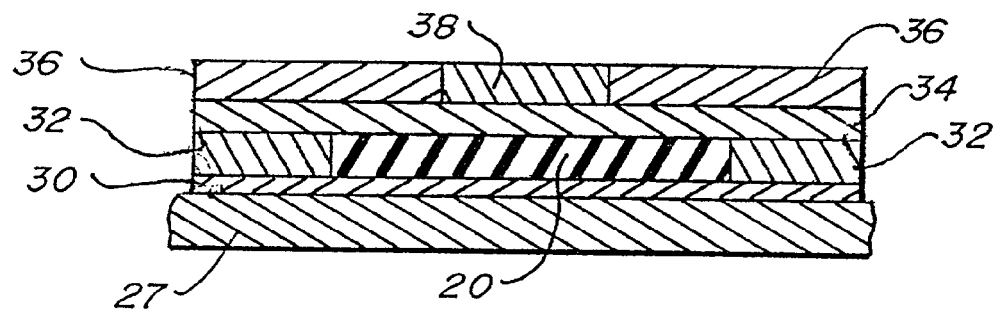
FIG. 5A is a cross-sectional view taken along line 5—5 of FIG. 4A wherein the magnetic core comprises a single layer of magnetic core material.

FIG. 4A depicts a top view of partially completed device 10 after completion of stage 2. FIG. 4B depicts a top view of partially completed device 10 incorporating the gap 42 after completion of stage 2. FIG. 5A depicts a cross-sectional view of partially completed device after completion of stage 2 wherein magnetic core 12 comprises a single layer of magnetic core material 38; silicon dioxide layer 30, insulating layer 32, lower conductor 20, dielectric layer 34, insulating layer 36, and single magnetic core material 38 layer are depicted. FIG. 5B depicts a cross-sectional view of partially completed device 10 after completion of stage 2 wherein magnetic core 12 comprises a plurality of magnetic core material 38 layers separated by dielectric layers 40; silicon dioxide layer 30, insulating layer 32, lower conductor 20, dielectric layer 34, insulating layer 36, plurality of magnetic core material 38 layers, and plurality of dielectric layers 40 are depicted.

I.C. Stage 3: Establishment of Vias

To establish vias 24, with reference to FIGS. 6 and 7, a dielectric layer 42 is first deposited over magnetic core 12 to provide isolation between magnetic core 12 and upper conductor 22. Dielectric layer 42 is preferably a polymer or silicon dioxide; however, other dielectrics may be used without departing from the spirit or scope of the invention. A thin aluminum hard mask is then preferably applied over dielectric layer 42. Next, a photoresist material is applied over the aluminum hard mask, and conducting vias 24 (holes) are defined using a via mask. The thin aluminum hard mask is then preferably etched to expose insulating layers 32 and 36 at the position of conducting vias 24.

Next, conducting vias 24 are preferably dry etched to remove insulating layers 32 and 36 down to lower conductor 20. Conducting material 44, preferably the same material as used for lower conductor 20 and upper conductor 22, is then electroplated or sputter deposited within vias 24. The photoresist layer is then etched, or otherwise dissolved. And, finally, the thin aluminum hard mask is etched from the surface in preparation for deposition of upper conductor 22.

FIG. 6 depicts a top view of partially completed device 10 after completion of stage 3. FIG. 7 depicts a cross-sectional view of partially completed device 10 after completion of stage 3; silicon dioxide layer 30, insulating layer 32, lower conductor 20, dielectric layer 34, insulating layer 36, magnetic core 12, dielectric layer 42, and vias 24 filled with conducting material 44 are depicted. Layer 46 can also encapsulate layers 42, 36, 32 and part of substrate 27.

I.D. Stage 4: Addition of Upper Conductor

The fabrication processes and sequences used in forming the lower conductor are now repeated to form the upper conductor. The thickness of the lower and upper conductor is a predetermined value which takes into account the resistance of the conducting material, as is described in further detail in Section II below.

In the case of the electroplating process for formation of the conductors and magnetic layer, a mask is applied which covers the active part of the device and the area outside the mask is etched away to remove undesired portions of the remaining seed layer. Device 10, now substantially complete, is then encapsulated or otherwise protected, with a non-conductive dielectric material 46.

FIG. 8 depicts a top view of the now complete device 10, as it appears after completion of stage 4. FIG. 9 depicts a cross-sectional view of the now complete device 10, as it appears after completion of stage 4; silicon dioxide layer 30, insulating layer 32, lower conductor 20, dielectric layer 34, insulating layer 36, magnetic core 12, dielectric layer 42, vias 24 filled with conducting material 44, upper conductor 22, and dielectric material 46 encapsulation are depicted. Layer 46 can also encapsulate layers 42, 36 32 and parts of substrate 27.

It should be noted that variations on the above process, such as variations in planarization techniques, mask techniques, and deposition techniques, may be used without departing from the spirit or scope of the invention.

Further, the above describes a preferred manner of construction of device 10 wherein the bottom part of coil winding 18, i.e., lower conductor 20, is formed on the substrate, a magnetic core 12 is deposited over the lower conductor, and the top part of coil winding 18, i.e., upper conductor 22, is deposited over magnetic core 12 with vias 24 connecting upper and lower conductors 20, 22.

A different method of construction for an ultra-miniature device generally comprises the following steps. First, the base of the magnetic core is deposited on the substrate. Next, the coil windings are deposited on the base in a spiral fashion. Then, additional core material is deposited around the outside and in the center of the coil spiral to a height greater than the coil windings. Device 10 is then completed by depositing magnetic material over the top to complete the magnetic path. While this manner of construction of device 10 is feasible, it has undesirable restrictions including limits on the number of coil turns per unit area, difficulty in forming thick core structures, and the need to bring the inner ends of the coil to the outside. These restrictions are generally not found in the preferred method of construction.

Further, it should be noted that different patterns of the photomasks used for the various steps will yield different device features and performance characteristics. For example, by changing the placement of vias 24, the arrangement of lower and upper conductor 20, 22 paths, and the location of bonding pads 26, a designer has the ability to fabricate a single coil inductor having simple windings, multiple windings, or multiple connection taps. Further variations readily result in creation of a transformer having two or more windings, each of simple, bifilar, or multifilar configurations. The ratio of turns for each coil created can further be adapted to suit particular circuit requirements. Further, the sizes, spacing, and proximity of windings 18 to magnetic core 12 may be adapted for specific needs. Different magnetic core materials, conductor film materials, dielectric materials, processes, and sizes similarly yield variations in performance.

FIGS. 10A–10D depict a small sampling of the variations utilizing device 10. These variations include, but are not limited to, an inductor (10A), an inductor with a center-tap 50 (10B), a transformer (10C), and a transformer with a single primary coil and two secondary coils (10D).

II. Design Considerations for Ultra-Miniature Magnetic Device

In conventional inductor/transformer design, the designer is usually limited to selecting standard catalog core sizes and wire gauges. Deviation from standard core sizes and wire gauges usually results in high tooling costs, which can only be offset by large volumes. However, with the present device 10, these standard restrictions do not apply and the designer is provided with many design options and considerations, which can be and preferably should be addressed prior to fabrication of device 10 for a specific application. Some of these design considerations were discussed in section I above. Additional considerations to those above include a desire to produce device 10 with a high permeability, with a reduction of parasitic effects, and with a minimization of core losses; each of these considerations is discussed in detail below. After the design considerations discussion an example transformer design is provided.

II.A Producing the Device with a High Permeability

Generally, it is desirable to produce device 10 with the highest permeability (or inductance) that is reasonably achievable for the application in which device 10 is placed. A main factor in determining permeability is the size and shape of magnetic core 12. Equation 1 represents the initial permeability, $\mu i$, of a magnetic core:

$$\mu i = \frac{L}{4\pi * N^2} * \frac{lm * 10^9}{Ac} \qquad \text{Eq. (1)}$$

where: L is the inductance in Henries;

N is the number of turns in the coil about the core;

1 m is the magnetic path length in centimeters; and

Ac is the core cross-section area in square centimeters.

From Equation 1 it can be seen that both the core cross-section area (Ac) and the magnetic path length (1 m), i.e., core size and shape, are key factors in increasing or decreasing the permeability of device 10. The number of turns in the coil about the core is also important.

Referring to FIG. 11, a circular configuration of device 10 is depicted. This configuration is modeled after traditional toroidal inductors. However, as can be seen the number of turns, N, per unit area is quite small. Thus, inductance per unit area is generally lower than desired. Further, with reference to fabrication considerations, screens for electroplating are very complex. Thus, while the circular configuration is feasible, it does not provide the designer with optimal permeability or design options.

Referring to FIG. 12, a square configuration of device 10 is depicted. This configuration is an adaptation of a toroid having four straight sides. This design has a higher density of turns than the circular configuration of FIG. 10 and all four sides can be connected together to yield a higher inductance. However, the drawback of this design is that the turns, N, per unit area is still fairly small and the resulting transformer is generally physically larger than desired for high frequency applications. Further, with reference to fabrication considerations, screens for electroplating are very complex. Thus, while the square configuration is also feasible, it does not provide the designer with optimal permeability or design options.

Figure 13:
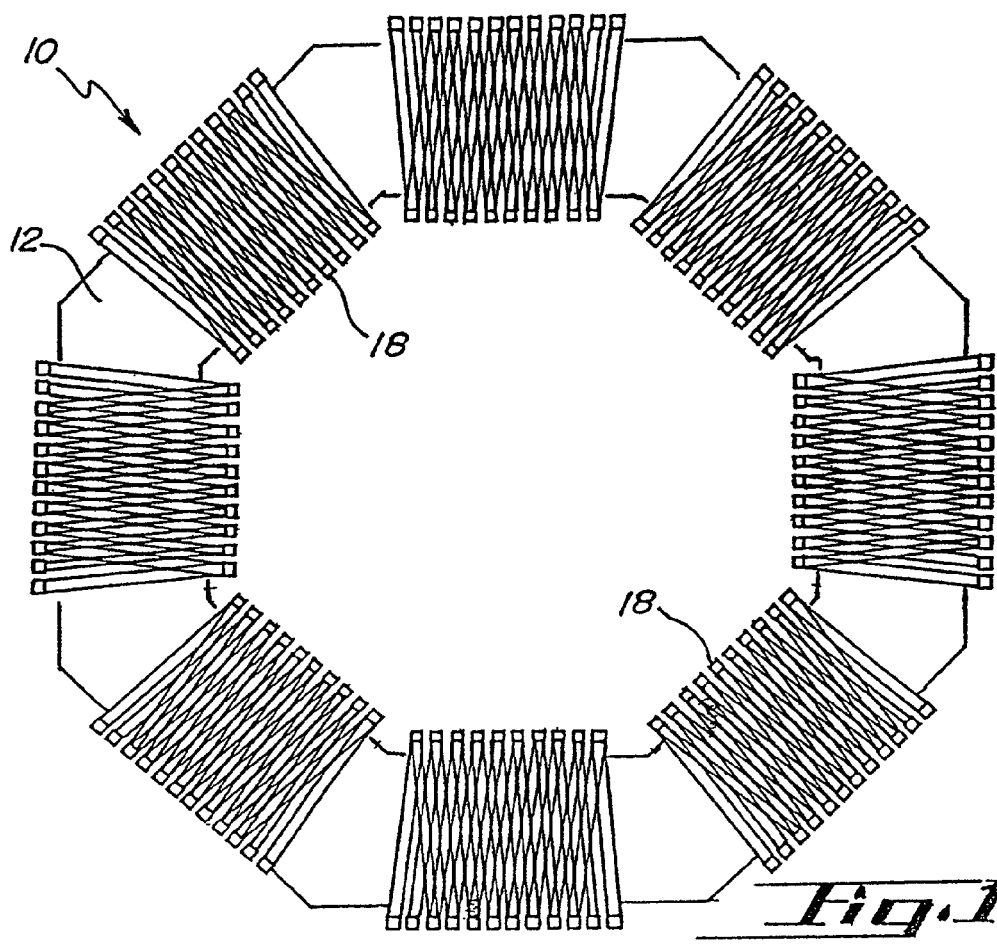
FIG. 13 depicts an octagonal configuration of ultra-miniature magnetic device of the present invention.

Referring to FIG. 13, an octagonal configuration of device 10 is depicted. This configuration enables an increase in the number of turns, however, the physical size of device 10 grows rapidly and the resulting inductance per unit area is low. Further, with reference to fabrication considerations, screens for electroplating are very complex. Thus, while the octagonal configuration is also feasible it does not provide the designer with optimal permeability or design options.

Figure 14:
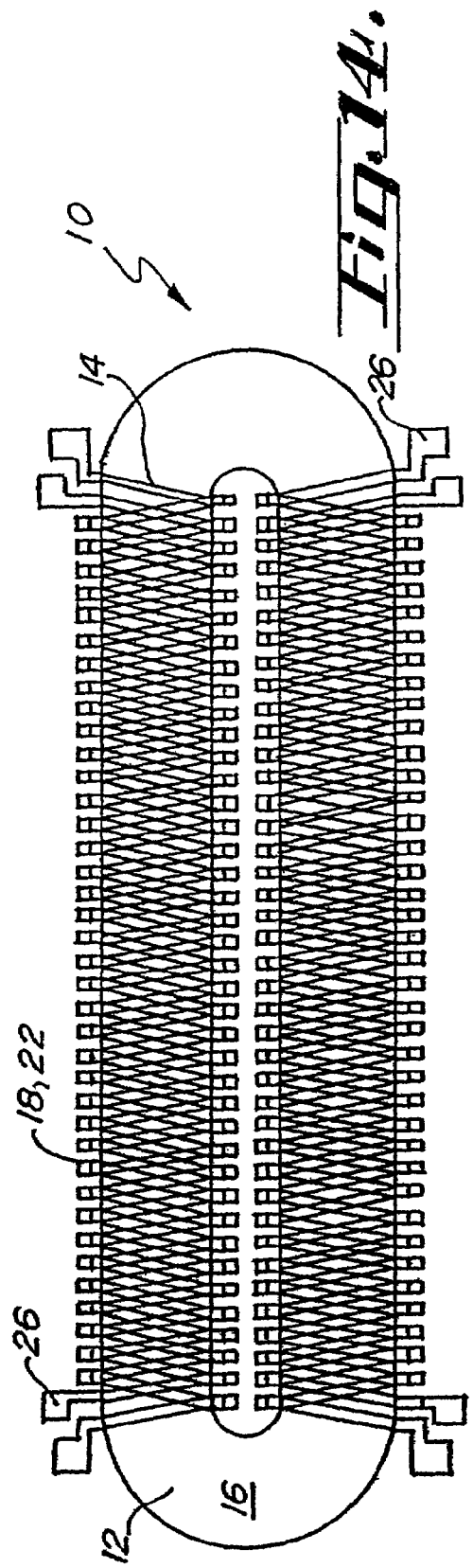
FIG. 14 depicts an oval configuration of ultra-miniature magnetic device of the present invention.

Referring to FIG. 14, an oval configuration of device 10 is depicted. This oval configuration and the rectangular configuration of FIG. 1 are the preferred configurations and provide advantages which the other configurations do not provide. Specifically, with respect to permeability (or inductance), the elongate shape allows an inductor/transformer to be fabricated with windings 18 distributed on either side of magnetic core 12. Thus, coil windings 18 may be of a larger cross-section and, therefore, of a lower resistance.

Additional advantages, beyond the high permeability advantage, is that the elongate designs provide for a straight forward layout wherein both elongate sides and short sides may be lengthened or shortened as desired. Further, these designs may be scaled up or down in the X-Y plane to meet the demands of operational frequency and physical constraints. The elongate shape affords more space for the placement of the internal segments of conductors 20, 22. This translates to lower process precision requirements, lower production costs and greater reliability.

Additionally, these elongate configurations can be fabricated easily by several methods, including thin or thick film procedures, electroplating, vacuum deposition and etching processes (including PECVD, RF sputter deposition, reactive ion etching, ion milling, plasma etching, photo-lithographic processes, and wet chemical etching). Further, these elongate configurations allow for orientation of the easy magnetic axis in the direction of magnetic core 12 (see FIG. 15A), at 90° to the direction of the core (see FIG. 15B), or at any angle with respect to the direction of magnetic core 12 by subjecting magnetic core 12 to an external magnetic field 52, thus satisfying different core saturation requirements (e.g., energy storage vs. maximum inductance).

Moreover, with these elongate configurations, layering of magnetic core 12 with thin dielectric interlayers to reduce core losses is also an easily obtained option. As well, the elongate rectangular or oval configurations yield an optimum magnetic path length and allow a repeatable straight-line path for coil winding.

In designing the preferred elongate-shaped configurations of device 10, the following should also be kept in mind with reference to Equation 1 above and Equation 2 below. First, it should be noted that increasing the thickness of magnetic core 12 also increases its cross-sectional area. A 10× increase in cross sectional area, Ac, results in a 10× increase in inductance. However, an increase in thickness of magnetic core 12 only results in a small increase in coil winding DC resistance. In addition, as the area of magnetic core 12 increases, the flux level of device 10 decreases, see Equation 2 for magnetic flux density, $\beta$ $$\beta = \frac{E * 10^8}{4.0 * Ac * F * N} \qquad \text{Eq. (2)}$$

where: E is the drive voltage applied to device 10, e.g. 5 v;
4.0 is a constant for a square wave;
Ac is the cross-sectional area of the magnetic core;
F is the primary operating frequency, e.g. 10 MHz; and
N is the number of turns in the coil winding.

Thus, in Equation 2, increasing Ac by 2× decreases the flux density by 2×. Since the maximum flux density is a fixed quantity for any core material, the low frequency cut-off is lowered for any increase in core cross-sectional area. Increasing the cross-sectional area permits an increase in the drive voltage, E, applied to the device, however, breakdown of the dielectric material imposes a practical limit to the drive voltage.

Further, with reference to the magnetic core material and permeability, as indicated in section I above, the preferred core material is an iron/nickel/cobalt composition (15/65/20%). This material is chosen because it has a high nickel content and, therefore, a high permeability. Further, the saturation level of the material can sustain high levels of flux density and a small number of turns can achieve the desired inductance.

II.B. Reduction of Parasitic Effects

In using device 10 as a transformer, parasitic effects are of concern. As such, with reference to the transformer model of FIG. 16, these parasitic effects and methods to reduce them so as to extend the operation of device 10 in the high frequency range are discussed below.

Figure 16:
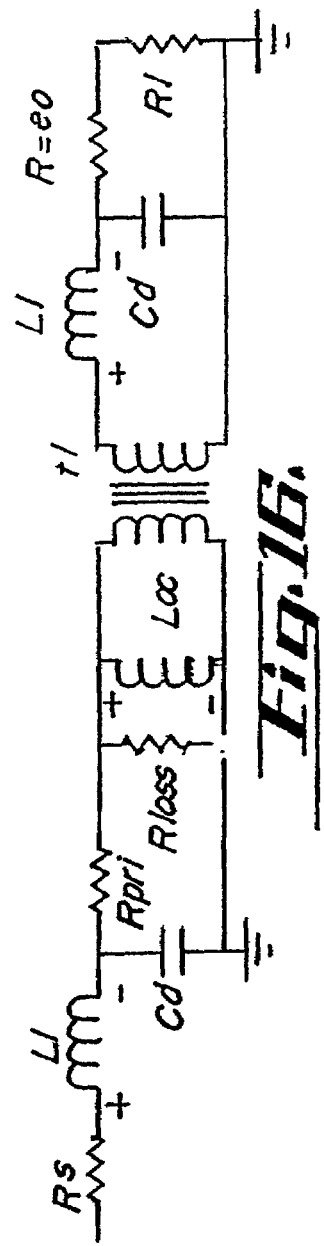
FIG. 16 depicts a transformer model.

The first parasitic effect of concern with reference to FIG. 16 is the distributed capacitance, Cd. The distributed capacitance, Cd, operates to limit the upper bandwidth of device 10, an undesired effect. However, by using a high permeability material, such as the preferred iron/nickel/cobalt composition (15/65/20%), the distributed capacitance can be kept to a minimum by using fewer turns to attain the same inductance.

The second parasitic effect of concern with reference to FIG. 16 is leakage inductance. It is preferable to keep leakage inductance to a minimum. This may be accomplished by winding primary and secondary coils closely to each other, i.e. bifilar winding. The result of this is an increase in the coupling coefficient (the coupling of the magnetic lines of flux between the primary and secondary winding), which operates to reduce leakage inductance.

A third parasitic effect of concern is the DC resistance (Rpri and Rsec) of the coil windings 18. As mentioned earlier, a large number of coil turns yields a high inductance. However, too many turns increases the DC resistance to a generally unacceptable level. Additional coil turns also cause an increase in distributed capacitance, Cd, of device 10 as described earlier. Reduction of the DC resistance can be achieved by increasing the thickness and the width of upper and lower conductors 20, 22. Another method of reducing DC resistance is to use lower resistivity conductor material such as copper, silver or gold.

The above factors are also considerations in the fabrication of inductors.

II.C. Core Losses

Core losses of the magnetic core material are yet another design factor to consider prior to fabrication of device 10 for a specific application. Note however, that core losses are not an overly significant factor if device 10 is to be used in communication applications. If device 10 is to be used in non-communication applications, the designer should be aware that there are parasitic effects that result from core material losses. One of these parasitic effects is dimensional resonance. Dimensional resonance is a result of eddy currents in an axis perpendicular to the desired magnetic flow. By reducing the permeability of the core material in the vertical axis but maintaining high permeability in the horizontal axis, the core losses are minimized. This is accomplished by separating multiple layers of magnetic core material, e.g., iron/nickel/cobalt composition (15/65/20%), by thin layers of dielectric material. Layering in this fashion significantly reduces eddy current losses.

Another reason to maintain a high permeability core relates to low frequency cut-off of the transformer. In order to reduce the low frequency cut-off point, the open circuit inductance must be increased. Referring to FIG. 16, the open circuit inductance (Loc), is in parallel with the load. As operating frequency decreases, the reactance of Loc decreases and limits the amount of signal or power transferred to the load. It is therefore desirable to maintain a high inductance, which necessitates a high permeability core.

II.D. Example Transformer Design

The following transformer example is provided as an illustration of one use of device 10 and is not to be taken as limitation on the broader invention of the ultra-miniature magnetic device which is suitable for many applications beyond that of a transformer.

In view of the above design considerations, a ultra-miniature magnetic device 10 may be specified to substantially equivocate the operation of an Ethernet transformer, specifically a transformer used in a common Access Unit Interface (AUI). An AUI is present on many Ethernet network interface cards, thus allowing backward compatibility. Each of the AUI's generally contain three 1:1 turns ratio transformers that operate at a primary frequency of 10 MHz and have additional high frequency components. An optimal Ethernet transformer has a desired coupling coefficient of 1.0 for a fast rise time signal. With the present device 10 operating as a transformer, this requires a very low leakage inductance and a minimal distributed capacitance.

As such, using device 10, N, the number of turns in coil winding 18 is chosen to be 20 turns for both primary and secondary coils. The size of conductors is preferably 5 μm thick by 50 μm wide. To minimize leakage inductance, the primary and secondary coils are bifilar (adjacent to each other). Magnetic core 12 width of 0.5 mm is preferably based on a desired device length limit of approximately 5 mm. Core thickness is preferably 5 μm. Upper and lower conductors 20, 22 are preferably of copper.

Figure 17:
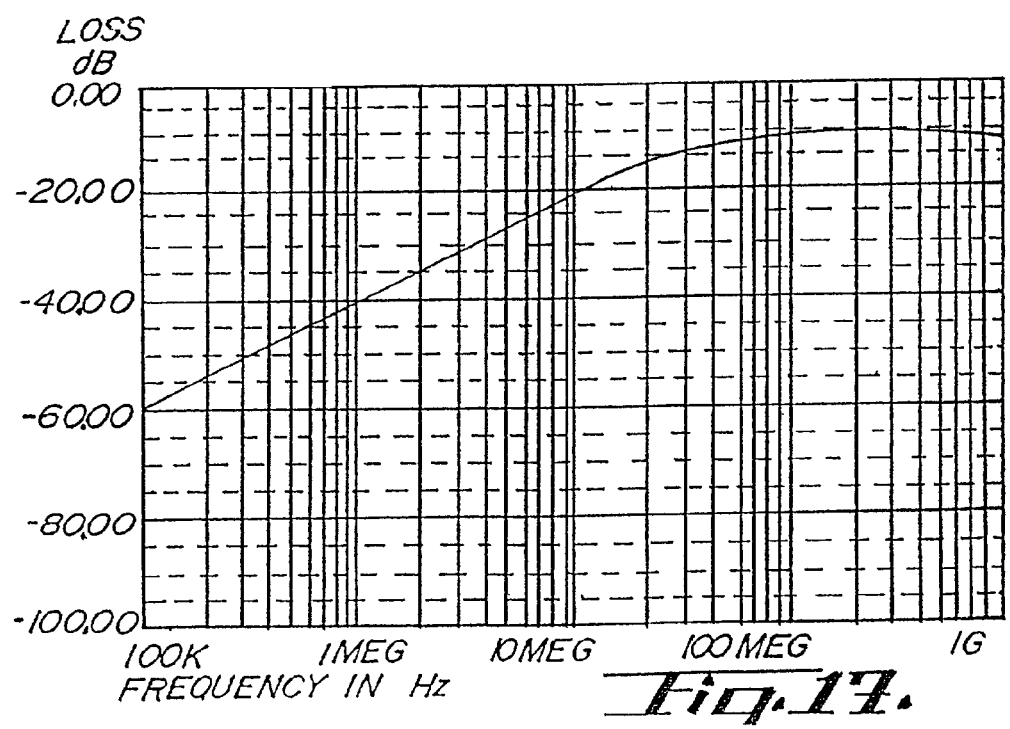
FIG. 17 is a plot of frequency vs. dB loss for a transformer designed with the ultra-miniature magnetic device of the present invention.

The response of a transformer fabricated using the elongate configuration of device 10 is expected to approximate the loss vs. frequency plot of FIG. 17. In comparing the plot of FIG. 17 with the plot of an actual Ethernet transformer, see FIG. 18, it can be seen that the designed transformer comparatively matches to the Ethernet transformer currently on the market.

III. Applications of Ultra-Miniature Magnetic Device

As described above, device 10 is preferably fabricated using traditional semiconductor technology and is therefore, suitable for automated production. This provides greater consistency, and hence greater quality control, and reduces manufacturing costs. As such, device 10 is suitable for many inductor/transformer applications including but not limited to, computer data transmission, cable TV video and interactive CATV and video circuitry, DC-DC converters, filters, miniature magnetic power devices, Ethernet network transformers, and other applications involving high frequency signals. Device 10 is also suitable for lower frequency applications such as in telephone line T1/E1 products, 64 KHz or 128 KHz ISDN lines and modem devices.

Device 10 can be readily adapted to provide a wide variety of electrical connections to suit the needs of various applications. Variations in the choice of methods of fabrication as well as choice of materials and sizes for magnetic core 12, conductors 20, 22 and dielectric layers yield predictably different electrical performance characteristics.

IV. Alternate Process for Fabricating Magnetic Device

As described in FIGS. 19A–19L, an alternate process 100 for fabricating a magnetic device uses a process of sequentially defining and building the magnetic device and via structures through various steps.

Figure 19A:
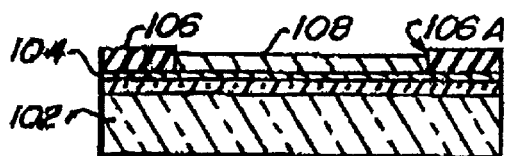
FIG. 19A illustrates a bottom (first) conductor of a coil member formed over a substrate and within a photoresist mold.
Figure 19B:
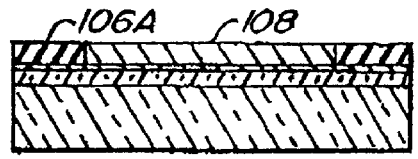
FIG. 19B illustrates the photoresist mold as it shrinks during a heat cure process.

In this example embodiment, process 100 begins with a 4" Si substrate 102 that has about a 1 μm SiO$_2$ layer formed thereon (FIG. 19A). In a related embodiment, a 4" glass wafer could also be used as a substrate. A Ti/Cu/Ti seed layer 104 is deposited by e-beam evaporation and patterned with the lower conductor mesh type seed pattern (FIG. 19A). A photoresist layer 106 is spun to a desired thickness and lithographically defined with the lower conductor 106A plating mold. The top Ti layer of seed layer 104 is selectively removed and the lower conductors (LC) 108 are plated to 5 μm using the Cu plating process described earlier. The LC (lower conductor) photoresist molds 106A are then cured, during which the molds shrink (106A), creating an almost level surface with the Cu plated lower conductors 108 (FIG. 19B).

Figure 19C:
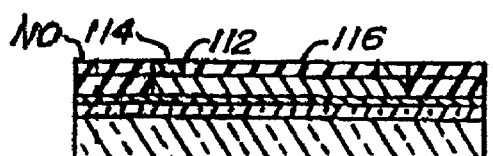
FIG. 19C illustrates the formation of the first partial via structures.

Referring to FIG. 19C, a layer of photoresist 110 is spun over the LCs 108 and their molds (106A). Photoresist layer 110 serves as an interlayer dielectric that electrically insulates the magnetic core (not shown) from the lower conductors 108. Photoresist layer 110 is lithographically patterned with a set of via holes 112, and then first partial via structures 114 are Cu plated (by making contact to the 1$^{st}$ seed layer 104) to the top of via holes 112. Photoresist layer 110 is then cured forming an ILD (interlayer dielectric) layer 116 (FIG. 19C).

Figure 19D:
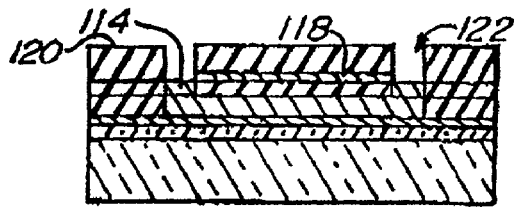
FIG. 19D illustrates the patterning of the second photoresist layer with via holes.

FIG. 19D illustrates a magnetic core seed layer 118 (similar to the LC seed layer 104 described above—Ti/Cu/Ti) that is e-beam evaporated onto ILD 116. Seed layer 118 is then patterned with the mesh type seed layer for the magnetic core. A photoresist 120 is then spun on layer 116 to a desired thickness of and lithographically patterned with via holes 122 co-linear with first partial via structures 114

Figure 19E:
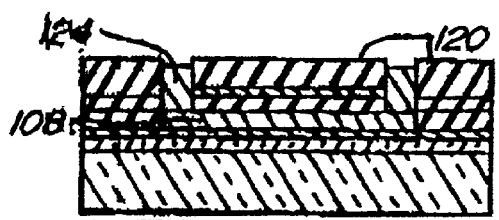
FIG. 19E illustrates the formation of the second partial via structures.

(FIG. 19D). Second partial via structures 124 are then formed by copper electroplating via holes 122 with 5 µm of material and by contacting LC layer 108 (FIG. 19E).

Figure 19F:
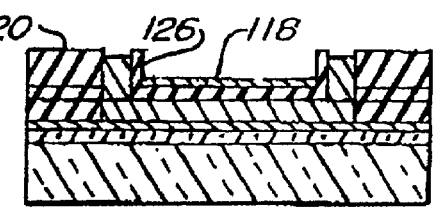
FIG. 19F illustrates the formation of a photoresist mold for forming the magnetic core arrangement.
Figure 19G:
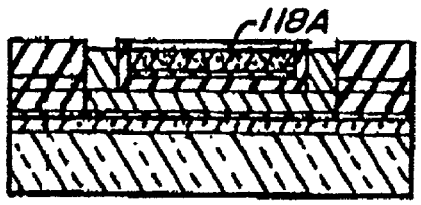
FIG. 19G illustrates the formation of the magnetic core arrangement.
Figure 19H:
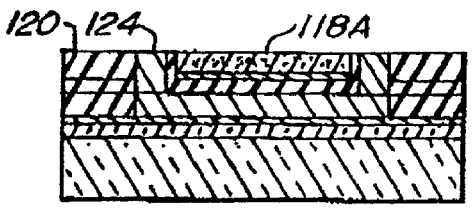
FIG. 19H illustrates the cured photoresist mold of the magnetic core arrangement.

Following the plating of second partial via structures 124, molds 126 for plating a magnetic core 118A are lithographically defined in the same photoresist layer 120 as via holes 122 (FIG. 19F). The top Ti layer of the core seed layer 118 is then selectively removed, and magnetic core arrangement 118A is plated with an NiFe electroplating process by contacting core seed layer 118. Core 118A is plated to a thickness of 5 µm in photoresist core molds 126 (FIG. 19G). Following the core plating, photoresist layer 120 that served as the molds for vias 124 and core 118A is cured. During this curing cycle, the photoresist 120 shrinks, creating an almost level surface with NiFe plated core 118A (FIG. 19H).

Figure 19I:
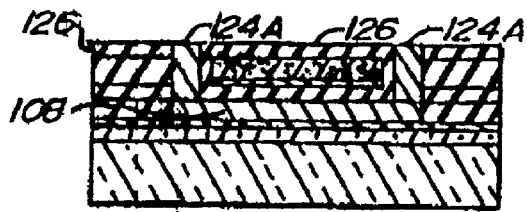
FIG. 19I illustrates the formation of the third partial via structures within a photoresist layer.

FIG. 19I illustrates a layer of photoresist 126 that is spun over second partial via structures 124 and core 118A along with their cured molds. Photoresist layer 126 serves as an interlayer dielectric ($2^{nd}$ ILD) that electrically insulates magnetic core 118A from a top conductor 132. Photoresist layer 126 is then lithographically patterned with via holes that are co-linear with second partial via structures 124. Following a chemical etch to remove any NiFe that may have been deposited on them, third partial via structures 124A are copper electroplated by contacting second partial via structures 124. Following this final via copper plating, second ILD layer 126 is cured.

Figure 19J:
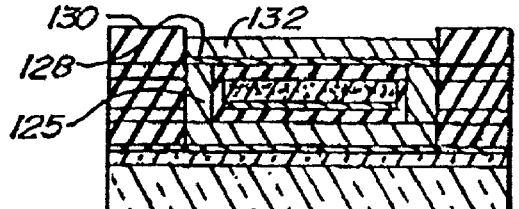
FIG. 19J illustrates the formation of a top (second) conductor of the coil member.
Figure 19K:
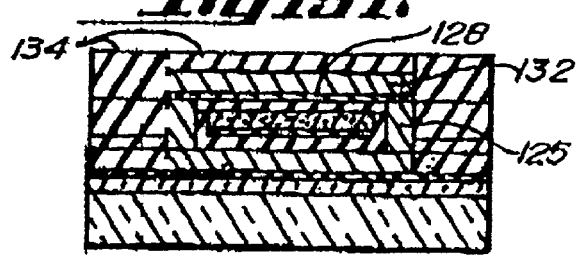
FIG. 19K illustrates encapsulation of the magnetic device.

FIG. 19J illustrates a Cu (top seed) film 128 that is deposited by e-beam evaporation on top of both second ILD layer 126 and completed via structures 125 (114/124/124A) to serve as the plating seed for the top conductors. The photoresist molds 130 are formed and top conductors 132 are electroplated completing the coil member of the magnetic device (FIG. 19J). Top conductor molds 130 are then removed along with a portion of top seed layer 128, followed by a spinning and curing of photoresist 134 to protect and encapsulate top conductors 132 (FIG. 19K).

Figure 19L:
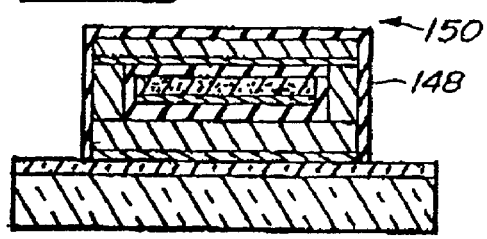
FIG. 19L illustrates removing excess seed layer material to avoid shorting between adjacent magnetic devices.

Since the lower conductors 108 can still be electrically connected to other conductors through seed layer 104, an Al hard mask is deposited by e-beam evaporation. This Al layer is patterned to screen off magnetic device 150 so as to expose the areas of the mesh seed layers for the core and the lower conductors. An oxygen plasma etch is then used to etch through the cured photoresist exposing the edges of mesh seed layers 104. Seed layers 104 are then etched thereby isolating the lower conductors 108. The Al mask is removed and the bonding pads are opened up to allow contact to the coil members (formed by conductors 108 and 132 and via structures 125), thus completing the fabrication of magnetic device 150 with an encapsulating layer 148 (FIG. 19L). The completed devices are tested for coil continuity and short circuits, and then are diced up and wire bonded to a ceramic package to facilitate device testing.

In a related embodiment, via structures 125 can be formed from two partial via structures instead of three. In one example, first partial via structures 114 are formed as shown in FIG. 19C, while the second partial via structures (124 and 124A) are formed, after magnetic core 118A is formed, by etching via holes into photoresist layers 120 and 126 that are co-linear with partial via structures 114. In another example, the first partial via structures of via structures 125 are formed after magnetic core 118A is formed but before photoresist layer 126 is formed. Photoresist layer 120 is patterned to include via holes to expose first conductor 108 and are then plated to form the first partial via structures. The second partial via structures are then formed by plating via holes in patterned photoresist layer 126 that are co-linear with the first partial via structures.

In another related embodiment, the three partial via structures (114/124/124A) that form via structures 125 are formed in a different order with respect to forming the magnetic core 118A. In this example, second partial via structures 124 are formed after forming the first partial via structures and after forming the magnetic core 118A. The third partial via structures are later coupled to the second partial via structures to form via structures 125.

In yet another example embodiment, the process of the present invention facilitates the formation of a via structure between two parallel conductors that are formed on insulative surfaces using semiconductor processing technology. In particular, seed layers are formed on the respective insulative layers to enhance the adherence of the conductor to the substrate or to an upper insulative layer. The via structure connects the two parallel conductors without using chemical-mechanical polishing (CMP) techniques.

In an example embodiment, the core is typically several µm thick (on the order of 10–50 µm) to obtain reasonable magnetic characteristics. This thickness is prohibitive to a IC manufacturing process due to planarity issues since the IC would normally be on the order of 2–3 µm thick. The following table contains the device thickness buildup for a reasonable transformer of normal thickness:

|  | Normal |
| --- | --- |
| Lower dielectric layer | 5 µm |
| Lower conductor | 5 µm |
| Second dielectric layer | 5 µm |
| Core | 5 µm |
| Third dielectric layer | 5 µm |
| Upper conductor | 5 µm |
| Total device height | 30 µm |

In another related embodiment, magnetic core 118 is formed by alternating depositions of magnetic material and dielectric material layers until magnetic core 118 has reached the desired thickness (FIGS. 19H and 19I).

In one example embodiment, magnetic device 150 has twenty turns for the primary and ten turns for the secondary with each one having two via structures. In this example, there are 40 via structures just on one side. Due to the number of via structures, via contact resistance should be avoided, especially by removing any copper oxide after any copper plating steps. Theoretical resistance for each coil should not exceed 1.04 ohms. In this example embodiment, the 5 µm conductors (lower and upper) are about 50 µm in width and are separated by about 50 µm. The lower and top conductors are about 700 µm in length across the core. The via structures are about 50 µm×75 µm and extend from the lower conductors to the top conductors. The core has a width of about 565 µm and is about 5 µm in thickness.

With the various embodiments described, the problem of overetching layer 110/120, especially at the bottom of the via hole close to magnetic core 118/118A, to form via structures 125 is avoided. Overetching has led to electrical shorting of the via structures with the magnetic core after the photoresist layers are etched and plated to form the via structures. The etching usually cause the via holes to fan out near the bottom conductor and the magnetic core. Very little or no material is left between the via structure and the magnetic core.

Building the device in sequential steps avoids the use of CMP (chemical mechanical polishing) techniques necessary to eliminate dimples in the insulation layers, or plated layers, that can occur during plating of deep via holes.

In the various embodiments described, the magnetic device is typically formed on a distinct substrate, separate from active IC components. The height differential on the substrate between passive (e.g., magnetic devices; about 10–100 μm) and active components (about 3 μm) is and the incompatible fabrication techniques of passive devices usually demand separate fabrication processes and substrates before the completed devices are used as components in an electrical system.

The present invention may be embodied in other specific forms without departing from the essential attributes thereof; therefore, the illustrated embodiments should be considered in all respects as illustrative and not restrictive, reference being made to the appended claims rather than to the foregoing description to indicate the scope of the invention.

What is claimed:

1. A method for fabricating a magnetic device using semiconductor technology comprising the steps of:
   forming a first conductor over a substrate;
   patterning a first photoresist layer disposed over the first conductor to form via holes that expose a portion of the first conductor;
   forming first partial via structures within the via holes that are connected to the first conducton;
   forming a second photoresist layer disposed over the first conductor and the first partial via structures and using the second photoresist layer to form a magnetic core arrangement disposed over the first conductor;
   patterning a third photoresist layer disposed over the magnetic core arrangement and the second photoresist layer to form via holes co-linear with the first partial via structures;
   forming second partial via structures within the co-linear via holes that are connected to the first partial via structures; and
   forming a second conductor over the magnetic core arrangement connected to the second partial via structures, thereby forming via structures adapted to electrically connect the first conductor to the second conductor.

2. The method of claim 1 wherein forming the first conductor over the substrate comprises:
   forming an insulative layer on the substrate;
   forming a composite metal layer on the insulative layer; and
   forming the first conductor using a photoresist mold formed on the composite metal layer, the photoresist mold exposing a portion of the composite metal layer, by removing a top layer of the composite metal layer and depositing a first conductor material within the photoresist mold and over the exposed portion of the composite metal layer.

3. The method of claim 2, wherein the composite metal layer is comprised of a copper layer interposed between a bottom and top layer of titanium.

4. The method of claim 1, further comprising using the patterned first photoresist layer as a first interlayer dielectric layer between the first conductor and the magnetic core arrangement upon heat curing the first photoresist layer.

5. The method of claim 4, further comprising forming a magnetic core seed layer over the first interlayer dielectric layer and removing a top layer of the magnetic core seed layer before forming the magnetic core arrangement.

6. The method of claim 5, further comprising forming a second conductor seed layer over a second interlayer dielectric layer, using the patterned third photoresist layer, before forming the second conductor.

7. The method of claim 6, further comprising removing portions of the second conductor seed layer extending beyond the via structures and encapsulating the magnetic device.

8. The method of claim 7, further comprising removing portions of the composite metal layer extending beyond the via structures.

9. The method of claim 1, further comprising providing the substrate having an insulating layer thereon, wherein the substrate is void of active components associated therewith and wherein fabrication of the magnetic device occurs separately, distinctly, and on a different substrate from the fabrication of active components to which said magnetic device may be connected.

10. The method of claim 1, wherein the magnetic core arrangement is comprised of at least two elongate sections separated by a central aperture and at least two short sections separated by the central aperture.

11. The method of claim 1, wherein the first conductor and the second conductor are electrically connected to produce a winding selected from a group consisting of: a simple winding, a bifilar winding, and a multifilar winding.

12. The method of claim 10, further comprising the step of subjecting the magnetic core arrangement to an external magnetic field to align an easy axis of said magnetic core along a desired direction relative to said at least two elongate sides.

13. The method of claim 1, wherein forming the magnetic core arrangement comprises the steps of depositing a layer of magnetic core material and depositing a layer of dielectric material, and repeating said steps of depositing said layer of magnetic core material and depositing said layer of dielectric material until said magnetic core is of a desired thickness.

14. The method of claim 1, wherein said step of depositing said layer of magnetic core material includes incorporating an air gap into said layer of said magnetic core material.

15. The method of claim 1, wherein the magnetic core arrangement is comprised of four equal length sections surrounding a central aperture.

16. A method for fabricating a magnetic device using semiconductor technology comprising the steps of:
   forming a first conductor over a substrate;
   patterning a first photoresist layer disposed over the first conductor, thereby forming via holes that expose a portion of the first conductor;
   forming first partial via structures within the via holes that are connected to the first conductor;
   patterning a second photoresist layer disposed over the first conductor and the first partial via structures to form via holes co-linear with the first partial via structures;
   forming second partial via structures within the co-linear via holes that are connected to the first partial via structures;
   forming a magnetic core arrangement disposed over the first conductor using a portion of the second photoresist layer;

patterning a third photoresist layer disposed over the magnetic core arrangement and the second partial via structures to form via holes co-linear with the second partial via structures;

forming third partial via structures within the co-linear via holes that are connected to the second partial via structures; and forming a second conductor over the magnetic core arrangement connected to the third partial via structures, thereby forming via structures adapted to electrically connect the first conductor to the second conductor.

17. The method of claim 16, wherein forming the first conductor over the substrate comprises:

forming an insulative layer on the substrate;

forming a composite metal layer on the insulative layer; and forming the first conductor using a photoresist mold formed on the composite metal layer, the photoresist mold exposing a portion of the composite metal layer, by removing a top layer of the composite metal layer and depositing a first conductor material within the photoresist mold and over the exposed portion of the composite metal layer.

18. The method of claim 17, wherein the composite metal layer is comprised of a copper layer interposed between a bottom and top layer of titanium.

19. The method of claim 16, further comprising using the patterned first photoresist layer as a first interlayer dielectric layer between the first conductor and the magnetic core arrangement upon heat curing the first photoresist layer.

20. The method of claim 19, further comprising forming a magnetic core seed layer over the first interlayer dielectric layer and removing a top layer of the magnetic core seed layer before forming the magnetic core arrangement.

21. The method of claim 20, further comprising forming a second conductor seed layer over a second interlayer dielectric layer, using the patterned third photoresist layer, before forming the second conductor.

22. The method of claim 21, further comprising removing portions of the second conductor seed layer extending beyond the via structures and encapsulating the magnetic device.

23. The method of claim 22, further comprising removing portions of the composite metal layer extending beyond the via structures.

24. A method for fabricating a magnetic device using semiconductor technology comprising the steps of:

forming a first conductor over a substrate;

patterning a first photoresist layer disposed over the first conductor and using the first photoresist layer as an interlayer dielectric and to form a magnetic core arrangement disposed over the first conductor;

patterning the first photoresist layer to form via holes that expose a portion of the first conductor and forming first partial via structures within the via holes that are connected to the first conductor;

patterning a second photoresist layer disposed over the magnetic core arrangement and the first partial via structures to form via holes co-linear with the first partial via structures;

forming second partial via structures within the co-linear via holes that are connected to the first partial via structures; and forming a second conductor over the magnetic core arrangement connected to the second partial via structures, thereby forming via structures adapted to electrically couple the first conductor to the second conductor.

25. A method for fabricating a magnetic device using semiconductor technology comprising the steps of:

forming a first conductor over a substrate;

patterning a first photoresist layer disposed over the first conductor to form via holes that expose a portion of the first conductor;

forming first partial via structures within the via holes that are connected to the first conductor;

forming a magnetic core arrangement disposed over the first conductor using a portion of a second photoresist layer disposed over the first photoresist layer and the first partial via structures;

patterning the second photoresist layer to form via holes co-linear with the first partial via structures;

forming second partial via structures within the co-linear via holes that are connected to the first partial via structures;

patterning a third photoresist layer disposed over the magnetic core arrangement and the second partial via structures to form via holes co-linear with the second partial via structures;

forming third partial via structures within the co-linear holes that are connected to the second partial via structures; and forming a second conductor over the magnetic core arrangement connected to the third partial via structures, thereby forming via structures adapted to electrically connect the first conductor to the second conductor.

* * * * *